(12) United States Patent
Doty et al.

(10) Patent No.: US 7,282,919 B2
(45) Date of Patent: Oct. 16, 2007

(54) NMR CRYOMAS PROBE FOR HIGH-FIELD WIDE-BORE MAGNETS

(75) Inventors: F David Doty, Columbia, SC (US); Siddarth Shevgoor, Columbia, SC (US)

(73) Assignee: Doty Scientific, Inc., Columbia, SC (US)

( * ) Notice: Subject to any disclaimer, the term of this patent is extended or adjusted under 35 U.S.C. 154(b) by 112 days.

(21) Appl. No.: 11/275,933

(22) Filed: Feb. 6, 2006

(65) Prior Publication Data

US 2006/0176056 A1 Aug. 10, 2006

Related U.S. Application Data

(60) Provisional application No. 60/593,752, filed on Feb. 10, 2005.

(51) Int. Cl.
*G01V 3/00* (2006.01)

(52) U.S. Cl. .................................................. 324/321

(58) Field of Classification Search ........ 324/300–322; 62/600, 45.1, 50.1–50.2, 51.1–54.3, 304–316, 62/389–400, 440–530
See application file for complete search history.

(56) References Cited

U.S. PATENT DOCUMENTS

| | | | |
|---|---|---|---|
| 4,446,430 A | 5/1984 | Stejskal | |
| 4,511,841 A | 4/1985 | Bartuska | |
| 4,641,098 A | 2/1987 | Doty | |
| 4,654,592 A * | 3/1987 | Zens | 324/307 |
| 4,940,942 A * | 7/1990 | Bartuska et al. | 324/321 |
| 5,202,633 A * | 4/1993 | Doty et al. | 324/321 |
| 5,289,130 A * | 2/1994 | Doty | 324/321 |
| 5,325,059 A * | 6/1994 | Doty | 324/321 |
| 5,424,645 A | 6/1995 | Doty | |
| 5,508,613 A | 4/1996 | Kotsubo | |
| 5,508,615 A * | 4/1996 | Doty et al. | 324/321 |
| 5,872,452 A | 2/1999 | Cory | |
| 6,130,537 A | 10/2000 | Doty | |
| 6,411,092 B1 | 6/2002 | Anderson | |
| 6,583,622 B1 * | 6/2003 | Hills | 324/307 |
| 6,677,751 B1 | 1/2004 | Marek | |

(Continued)

OTHER PUBLICATIONS

Doty et al., "Magnetism in High-Resolution NMR Probe Design. II: HR MAS," Concepts in Magentic Resonance, 1998, pp. 239-260, vol. 10, No. 4.

*Primary Examiner*—Brij Shrivastav
*Assistant Examiner*—Dixomara Vargas
(74) *Attorney, Agent, or Firm*—Oppedahl Patent Law Firm LLC

(57) ABSTRACT

"An MAS probe is disclosed for obtaining a substantial improvement in signal to noise (S/N) in triple-resonance high-resolution (HR) magic-angle-spinning (MAS) NMR of samples near room temperature (RT) in high-field magnets where the magnet's RT shim bore is greater than 60 mm. All critical circuit components, including the sample coils, are located along with the spinner assembly in a thermally insulated cold zone pressurized with helium gas. The spinner assembly attaches to a sealed, curved, rotor-loading tube to permit automatic sample change, and it is surrounded by a partially insulated jacket cooled with a cryogenic fluid, generally nitrogen gas. The MAS probe is also compatible with magic angle gradients, variable temperature operation, field locking, and commonly available closed-cycle cold fingers."

37 Claims, 3 Drawing Sheets

U.S. PATENT DOCUMENTS

| | | | |
|---|---|---|---|
| 6,686,740 B2 * | 2/2004 | Tschirky et al. | 324/321 |
| 6,937,020 B2 * | 8/2005 | Munson et al. | 324/321 |
| 7,081,753 B2 * | 7/2006 | Mullen et al. | 324/318 |
| 7,151,374 B2 * | 12/2006 | Doty | 324/321 |
| 7,170,292 B2 * | 1/2007 | Doty et al. | 324/321 |
| 7,196,521 B2 * | 3/2007 | Doty | 324/321 |
| 2006/0082371 A1 | 4/2006 | Doty | |
| 2006/0152221 A1 | 7/2006 | Doty | |

* cited by examiner

NMR CRYOMAS PROBE FOR HIGH-FIELD WIDE-BORE MAGNETS

CROSS-REFERENCE TO RELATED APPLICATIONS

This application claims priority from U.S. application Ser. No. 60/593,752, filed Feb. 10, 2005, which application is incorporated herein by reference for all purposes.

FIELD OF THE INVENTION

The field of this invention is a probe for Nuclear Magnetic Resonance (NMR) Magic Angle Spinning (MAS) with cryogenically cooled sample coils and other critical circuit components while the sample is near room temperature.

BACKGROUND OF THE INVENTION

Because of the richness of the information available from NMR, it has often been argued that NMR is the most powerful analytical technique for molecular structure determination. However, NMR has been more successful with liquids or materials dissolved in solvents than with rigid solids. The basic problem in NMR of solids is that rapid molecular tumbling and diffusion are not naturally present to average out chemical shift anisotropy and dipolar couplings of abundant spin nuclides. Hence, the lines are normally broad and unresolved (often hundreds of ppm in width). A large number of techniques have been developed to improve the resolution in NMR of solids, but most modern techniques include extremely rapid spinning of the sample at the "Magic Angle" (the zero of the second Legendre polynomial, 54.7°) with respect to $B_0$. If the rotational rate is fast compared to chemical shift anisotropies and dipolar couplings (in units of Hz), the resolution is dramatically improved—often by two or three orders of magnitude. Even when the spinning is not fast enough to satisfy the above conditions, substantial improvements in resolution are generally obtained from the combination of MAS and multiple-pulse methods. Similar resolution problems are encountered in liquids of inhomogeneous systems, as in tissues and the mixtures of liquids and solids, because of susceptibility variations throughout the material. Here, relatively slow MAS is often effective in improving the spectral resolution of the liquid species by several orders of magnitude.

In U.S. Pat. No. 4,511,841, Bartuska discloses a modified Beams-type Bernoulli out-flow drive for MAS; and in his later U.S. Pat. No. 4,940,942, he discloses a method of improving its axial stability and providing variable temperature operation for the sample. In U.S. Pat. No. 5,508,615, I disclose a method of suppressing whirl instability in the radial bearings at very high surface speeds in MAS and improving the stability of balanced axial hydrostatic bearings, similar to the one used in U.S. Pat. No. 5,202,633. In a co-pending patent application (U.S. Publication No. 2006/0082371), I disclose a novel Bernoulli inflow axial bearing that is particularly advantageous for MAS when a ceramic dewar is required between the rotor and the sample coils.

The progress in increasing sensitivity in NMR has been impressive over the past five decades—three to five orders of magnitude, depending on the application. The most significant, generally applicable contribution to increasing the signal to noise ratio, S/N or SNR, in the past decade has been the introduction of cryoprobes for homogeneous liquid samples, such as that by Marek, U.S. Pat. No. 6,677,751 B1, in which the receiver coil, critical tuning elements, and preamps are cryogenically cooled while the sample is kept at some experimentally desired temperature, usually near room temperature (RT). Using high-purity aluminum coils and single-layer capacitors near 25 K with the preamps perhaps at 80 K, the S/N may be increased on one or more channels in a multi-resonant probe by typically a factor of three to four. The objective of this invention is to permit similar improvements in S/N in triple-resonance HR MAS NMR in high field magnets without cooling the sample, at least in wide-bore magnets.

Most modern NMR applications are directed at structure determinations of complex macromolecules, where it is often desirable to utilize a probe with high S/N at two or three different frequencies simultaneously, most often $^1H/^{13}C/^{15}N$, and perhaps additionally be able lock the field on the $^2H$ resonance. RF circuit efficiencies in conventional 3 to 5 mm triple-resonance MAS probes with a single rf solenoid for signal reception at very high fields are typically in the range of 25-35% at the low-frequency (LF) and 15-40% at the mid-frequency (MF). For an example of a triple-resonance MAS circuit with a single sample solenoid, see my U.S. Pat. No. 5,424,645. Note that rf efficiency is usually defined as the percent of rf transmit power dissipated in the sample and the sample coil, as in principle other losses can be eliminated.

Significantly higher rf efficiencies on all channels in MAS have been achieved using a cross-coil for $^1H$ and a solenoid for the MF and LF, as in my U.S. Pat. No. 6,130,537 or as discussed by Doty et al in "Magnetism in NMR Probe Design Part II: HR MAS," in *Concepts in Magn. Reson.*, Vol 10(4), 239-260, 1998. Still efficiencies are generally in the range of 30-50% for both the LF and the MF channels. Moreover, most advanced MAS NMR applications are now at 11.7 T (500 MHz) or higher and also are requiring magic angle gradient (MAG) coils, as disclosed by Cory in U.S. Pat. No. 5,872,452, and automatic sample change, all of which tend to push rf efficiencies toward the low ends of the above ranges.

Thus far, high-resolution (HR) NMR probes in which the sample coil and other circuit elements are at cryogenic temperatures have only been demonstrated for liquid samples in which the sample tube is aligned with the polarizing field, $B_0$; and apparently in all prior CryoProbes, the sample coils are in an evacuated region for heat insulation reasons. Triple-resonance MAS probes in which both the sample and the sample coil may be simultaneously cooled to essentially the same temperature, both below 120 K, have been commercially available for high field magnets with 40 mm and larger RT shim bore for at least 15 years. In a few cases, cooling of the sample and sample coil to as low as 30 K has been possible in double-resonance MAS probes, but most critical tuning elements in such have not been cooled. Consequently, their gain in S/N has been limited.

While it is not difficult to achieve rf efficiency above 85% in single-tuned circuits, much lower efficiencies are always obtained in double- or triple-tuned circuits, especially for MAS probes, as noted above. The challenges are greater in MAS probes than in liquids probes partially because the circuits for solids NMR must also be designed to handle very high power, which requires larger circuit components and partially because it is often desirable to accommodate multinuclear tuning or one or more channels.

Using the same coil for both transmit and receive has been the preferred approach in NMR spectroscopy probes, both for liquids and solids, for at least three decades. In this case, Hoult's principle of reciprocity, which at least in its popular usage states that the NMR S/N during reception is, among other things, proportional to the square root of the circuit efficiency for generating a transverse rf magnetic field within the sample during transmit, has seldom been challenged.

Reciprocity, as defined above, fails to be valid when the various loss mechanisms (sample, sample coil, capacitors, shields, etc.) are at significantly different temperatures, as the transmit efficiencies are determined by the various resistances in the circuit, but the noise power during receive is proportional to both the resistance and its temperature. Hence, reciprocity fails in cryoprobes, such as that disclosed in U.S. Pat. No. 5,508,613, where the sample and perhaps some other minor loss components are much warmer than the sample coil. A co-pending application (U.S. Publication No. 2006/0152221), discloses another case in which reciprocity fails - when the sample coil is not cooled, but other critical circuit components are - that is practical in high field narrow bore magnets.

In the instant invention, the sample coil is also cooled, which permits considerably higher S/N but requires the use of a wide bore magnet, where the RT shim bore is typically 73 mm. The design is compatible with triple-resonance plus lock, MAG coils, extended-range variable temperature operation, automatic sample change, and commonly available closed-cycle cold fingers.

SUMMARY OF THE INVENTION

An MAS probe is disclosed for obtaining a substantial improvement in signal to noise (S/N) in triple-resonance high-resolution (HR) magic-angle-spinning (MAS) NMR of samples near room temperature (RT) in high-field magnets where the magnet's RT shim bore is greater than 60 mm. All critical circuit components, including the sample coils, are located along with the spinner assembly in a thermally insulated cold zone pressurized with helium gas. The spinner assembly attaches to a sealed, curved, rotor-loading tube to permit automatic sample change, and it is surrounded by a partially insulated jacket cooled with a cryogenic fluid, generally nitrogen gas. The MAS probe is also compatible with magic angle gradients, variable temperature operation, field locking, and commonly available closed-cycle cold fingers.

One major challenge in implementing CryoMAS is solving the problem of gas leakage from the spinner bearing, drive, and exhaust nitrogen into the cold zone, as some components will necessarily be ceramic, some plastic, and some metal. It is not desirable to use helium for the spinner bearing and drive gases for cost reasons and to prevent risk of degradation of o-ring-sealed magnet cryostats. A pressurized helium atmosphere in the cold zone may be utilized to prevent nitrogen flow from the spinner exhaust streams or atmosphere into the cold zone.

The drawback to a pressurized cold zone is that the heat transfer coefficient in dense helium at low temperatures is very high, making it challenging to cool the sample coils and all the large, critical, circuit components in a practical manner. Part of the solution here is to use a first-stage cooling-jacket around the major heat leaks near the spinner exhaust flows. The critical components may be insulated with fine glass wool or teflon foam and conduction cooled without cooling much of the cold zone below the temperature of the first-stage cooling. The use of coaxial sapphire capacitors allows the noise contributions from the most critical capacitors to be reduced to a minor fraction of the total.

DETAILED DESCRIPTION OF THE PREFERRED EMBODIMENT

Figure 1:
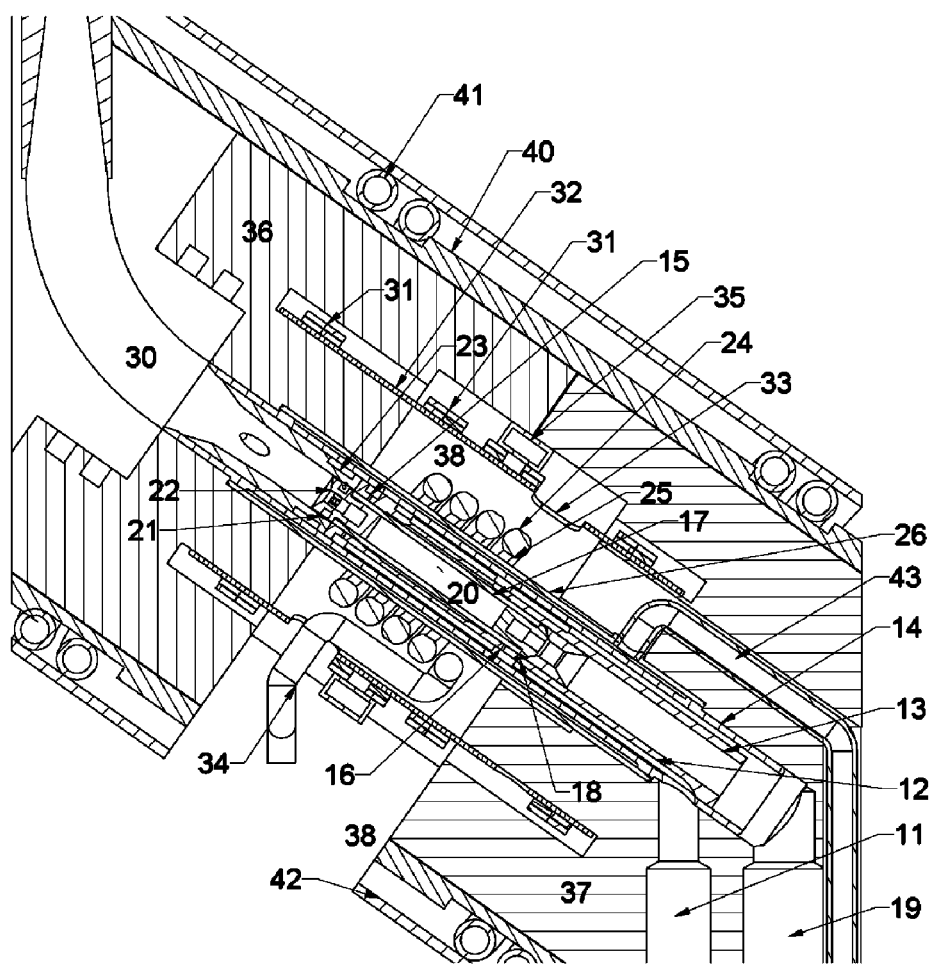
FIG. 1 is a cross-section the CryoMAS spinner assembly in the XZ plane.

FIG. 1 depicts a view in the XZ plane, roughly to scale, of a representative ceramic dewared spinner assembly suitable for a CryoMAS probe. Warm bearing gas may be supplied through a small metallic dewar 11 at just the rear end and ducted internally in a channel 12 between the innermost sleeve, identified as the zirconia spinner stator 13, and the inner zirconia dewar wall 14 to the bearing orifices 15, 16 near both ends of the ceramic rotor 17 and to the inflow Bernoulli bearing orifices 18 that form the axial bearing at the lower end of the rotor. The bearing gas temperature may be well below or well above room temperature, heated and sensed according to the prior art. Exhaust from the axial bearing and the lower bearing orifices 16 vents axially and then downward through a small metallic bearing exhaust dewar 19.

The ceramic rotor 17 containing the warm sample 20 is driven by warm nitrogen gas from drive nozzles 21 engaging a radial-inflow microturbine 22 attached to the upper end of the rotor 17. The drive manifold groove 23 in the spinner stator 17 is pressurized with nitrogen via another small metallic dewar not visible in this view, as it is off to the side to keep the region below the front of the spinner assembly free for the high-power reactive circuit elements needed to double tune the outer sample solenoid 24 for the LF and MF frequencies. The inner foil high-frequency (HF) cross coil 25, between the ceramic dewar outer wall 26 and the sample solenoid 24 is also not visible in this view, as it is very thin, typically about 0.05 mm thick, and may not have any features in the XZ plane, according to the prior art. Teflon, about 0.5 mm thick has most often been used in the prior art to insulate the cross coil from the outer solenoid; but in the CryoMAS case, sapphire (single-crystal aluminum oxide) may be a better thermal option, as it provides the thermal conduction needed so that the cross coil may be more effectively cooled by the conduction-cooled solenoid. However, its high dielectric constant will present isolation and tuning difficulties unless it is restricted to a short portion of the insulating sleeve, preferably near the center of the coils. In this context the sample being inside a rotor near room temperature typically means the sample has a temperature significantly above the coil temperature, and in an exemplary embodiment is between 100 K and 400 K in temperature.

The four small capacitors at each end used to tune the cross coil to the $^1$H frequency, according to the prior art in U.S. Pat. No. 6,130,537, are also not visible in this view, as they are not in the XZ plane. The inflow-Bernoulli axial bearing and other important spinner assembly details, especially related to the rotor tip plug and the Doty bearing, are disclosed in more detail in a co-pending application. Other types of Bernoulli axial bearings, such as those in U.S. Pat. No. 4,446,430 or in U.S. Pat. No. 4,940,942, could also be used, though with some disadvantages.

The drive gas vents up the curved rotor-loading tube 30, through which the warm rotor may be pneumatically ejected and a new one dropped into place. A high-performance magic-angle-gradient (MAG) coil 31, more closely related to that of Barbara and Bronnimann than that of Cory, but made of multi-layer windings and not constrained to a right cylinder, is supported on a MAG coilform 32 surrounding the spinner assembly and made according to the public domain prior art by Doty. The symmetry of the MAG coil allows four symmetrically disposed windows 33 through which leads 34 may be run to the solenoid through one window and likewise to the cross coils through another window, though typically fewer than four windows are required for these leads.

Prior art MAG coils have been mounted on ceramic cylinders lined with thin-copper-foil rf shields to minimize eddy currents, but the differential thermal stresses between the copper windings and a ceramic coilform make such an arrangement unsuitable for the CryoMAS probe. The preferred coilform material here is a high-resistivity, high-strength, low-susceptibility, low-outgassing alloy that can be readily electro-plated, such as C654 (3% Si, 1.5% Sn, 0.06% Cr, bal. Cu) and related high-silicon bronzes, including C876 (4.5% Si, 5.5% Zn, 0.2% Pb, 0.1% Mn, 0.1% Fe, bal. Cu). Another adequate alloy is C925 (11% Sn, 1.2% Ni, 1.2% Pb, 0.2% P, 0.1% Fe, bal Cu), and related high-tin bronzes. Preferably, the coilform 32 alloy would have weight composition of at least 70% copper, less than 20% zinc, less than 20% nickel, less than 8% chromium, less than 4% aluminum, less than 4% Pb, less than 0.2% iron, less than 0.2% cobalt, and at least 2.5% from the set comprised of tin, silicon, aluminum, and chromium, such that RT electrical conductivity is less than 12% that of pure copper. Such an alloy is herein defined as a type D alloy. The inside surface of the coilform must then be electroplated with gold, silver, or copper to several rf skin depths for low losses in the rf currents that will be induced therein from the sample coils, but the thickness must be limited to avoid excessive gradient eddy currents. For gold at 80 K for example, the thickness should be limited to approximately 0.003 mm.

A nitrogen-gas MAG-cooling loop 35 is affixed around the MAG coil for cooling to approximately 85 K. The high-conductivity copper windings and the MAG coilform, though of type D alloy, provide sufficient thermal conduction to keep the entire MAG coil near the temperature of the MAG cooling loop 35.

The ends of the dewared ceramic spinner assembly are enclosed in thermally insulating plastic sleeves 36, 37 that also may participate in sealing the warm nitrogen bearing, drive, and exhaust gases from the cold zone 38 external to the ceramic dewar outer wall 26. It may be impractical to insure that there will be no gas leaks between the nitrogen and helium regions, but it is necessary to insure that no nitrogen gas leaks into the cold helium zone, where it would deposit on the cold tuning elements and degrade performance. Hence, the cold helium zone 38 may preferably be maintained at a pressure greater than 1.1 atmosphere, via a suitable helium gas pressurization supply line, to prevent leakage from the spinner exhausts 19, 30 and from external atmosphere into the cold zone. Alternatively, if the gas leaks can adequately be eliminated, the cold zone may be evacuated to high vacuum, where satisfactory high voltage operation is possible. The intermediate vacuum regime, between about 1 mTorr and 1 atmosphere, is unsuitable for high-voltage operation. The cold zone may be pressurized to 5 atmospheres if necessary to prevent leakage flow from the bearing supply dewar 11 or drive manifold 23. In this context, "cold" typically means a range of about 25 K to 35 K, preferably below 30 K, and possibly below 15 K.

The substantial heat leaks from the warm exhaust ducts at both ends of the spinner assembly through the plastic sleeves 36, 37 may be accommodated by surrounding these sleeves with a cooling jacket 40 cooled by nitrogen-gas jacket-cooling loops 41 to about 90 K. This jacket, which may be of alumina ceramic or slotted type D alloy for minimal eddy currents, may then be externally insulated with teflon (PTFE) foam 42 from the helium gas surrounding it, which may be slightly colder, at least in places.

The rf solenoid 24 is preferably aluminum-plated copper with an aluminum core. The thin, high-purity aluminum surface plating presents lower resistance at low temperatures and high magnetic fields than copper, according to the prior art, as in U.S. Pat. No. 6,411,092 B1. The aluminum core provides magnetic compensation, according to the prior art, as in U.S. Pat. No. 6,130,537. The solenoid is conduction cooled to typically 30 K via thermally conductive sapphire-dielectric capacitors from each end to a cold ground plate, as discussed shortly. The cold solenoid 24 may be externally thermally insulated from the warmer MAG coilform by filling the space surrounding the rf solenoid with fine glass wool, for example, where the glass or quartz fiber diameter is typically in the range of 5 to 15 microns.

Note that the solenoid and all other high-voltage circuit elements may be in a pressurized helium atmosphere. Primarily because helium is monatomic, the ionization breakdown voltage (for the typical NMR pulse conditions) in helium at RT is about one-eighth that of air. Fortunately, the breakdown field $E_B$ in a dense gas at constant pressure is generally inversely proportional to $T^{3/2}$, so arcing in helium below 70 K is less of a problem than in air at RT for a given voltage. However, because of the space required for the ceramic dewar, the sample coil voltages must be higher than in conventional MAS probes for similar rf field strengths, so attention must be paid to high-voltage rf design. There is also the potential for ionization in the vacuum space within the ceramic dewar if the vacuum degrades to the point that the molecular mean free path is less than the separation gap between the inner wall 14 and outer wall 26. Hence, this space may need to be continuously pumped via a very small pumpdown stem (tube) 43 from the vacuum space to keep its pressure below 30 mTorr. For satisfactory sealing to zirconia and subsequent soldering to a larger evacuation tube, the pumpdown stem should be of platinum or of gold-plated titanium alloy or of vanadium and have a short flexible section to reduce stresses.

Figure 2:
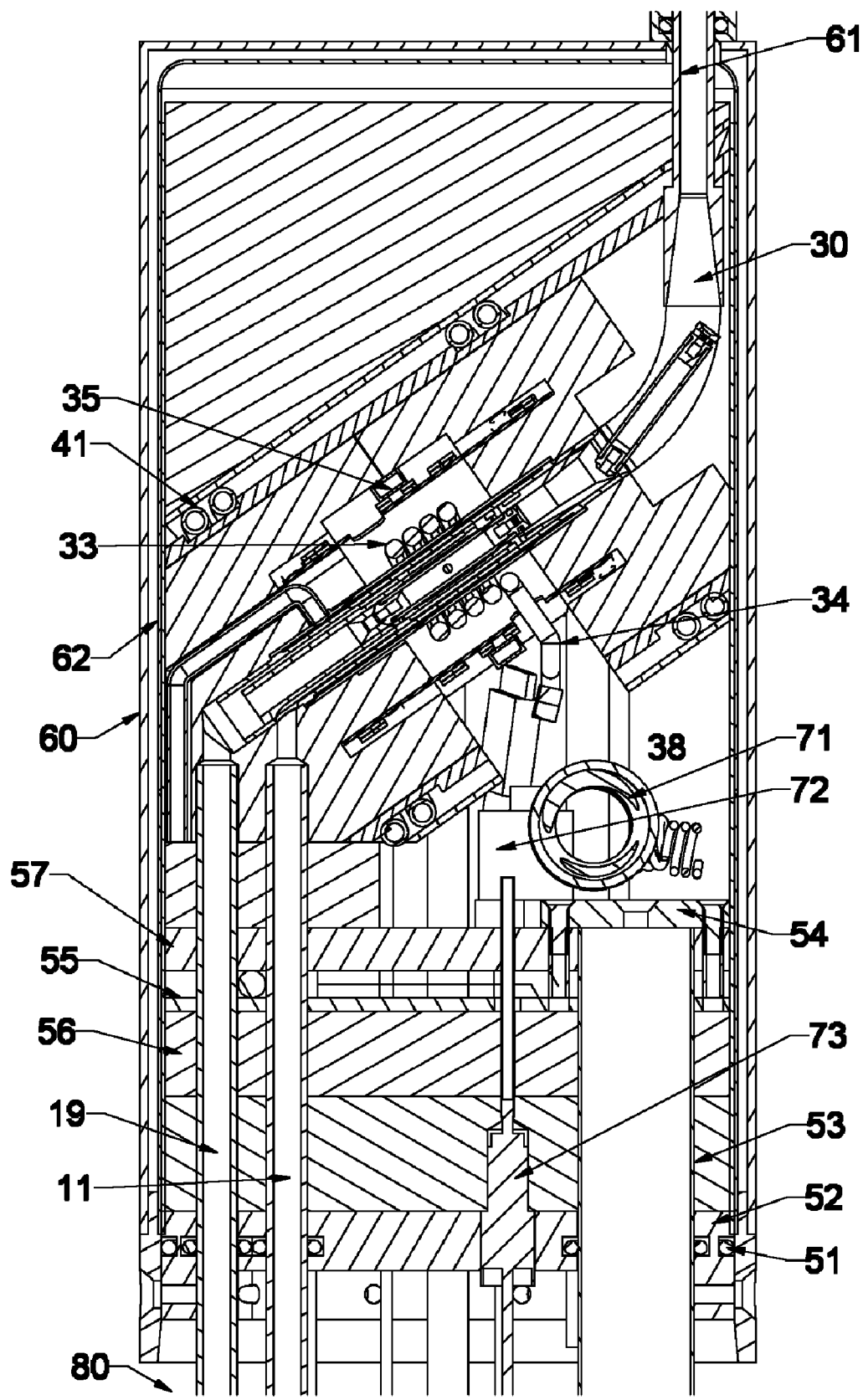
FIG. 2 is a longitudinal view of the CryoMAS probe layout in the XZ plane.

FIG. 2 shows a side overview of the upper portion of the cylindrical CryoMAS probe, for use in a wide-bore high-field NMR magnet, including the spinner assembly as was shown in more detail in FIG. 1. Note that the magnet's field strength would usually be greater than 7 T and at least greater than 4 T, as improvements in S/N in low-field applications could more easily be obtained by simply increasing the rotor size. The cold zone 38 is sealed by o-rings 51 at the RT gas-sealing barrier 52, where also are found o-ring seals to the outside of the small dewars 11, 19 and cold-finger dewar 53, which insulates the commercially available cold finger (not shown) containing a heat exchanger. The use of o-ring seals on the small dewars facilitates their replacement and position adjustment, as needed to accommodate minor angle adjustments of the spinner axis for precise setting at the magic angle. Alternatively, flexibility for adjustment of the magic angle and alleviation of stresses may be provided by utilizing short bellows tubing connections between the small dewars and the spinner assembly.

The helium-gas-cooled cold finger slides into the cold-finger dewar 53 and is attached to the second-stage cold plate, 54, typically of copper alloy with silver or gold plate. With sufficient attention to the cryo-engineering details, the heat leak can be made sufficiently small for compatibility with commonly available small, closed-cycle, gas-cooled, cold fingers that provide 6 W cooling at 30 K, for example, or perhaps larger cold fingers providing more cooling power or lower temperatures.

First-stage nitrogen cooling includes the MAG-coil cooling loop 35, the cooling jacket cooling loops 41, and the first-stage cool plate 55, which is thermally insulated above and below with foamed teflon 56, 57.

A low-magnetism bell dewar 60 surrounds the cold zone and is secured firmly to the barrier 52 to withstand the pressurization forces. The dewar also includes a sealed access duct 61 in the top, suitably designed for sufficiently low heat leak, through which the rotor-loading duct 30 may pass and be sealed. The inner wall 62 of the bell dewar is made predominately of a type D alloy and plated on the inside with silver, gold, or copper to a thickness of several rf skin depths at the operating temperature. It is similarly plated on its outer surface to minimize radiative heat transfer.

Figure 3:
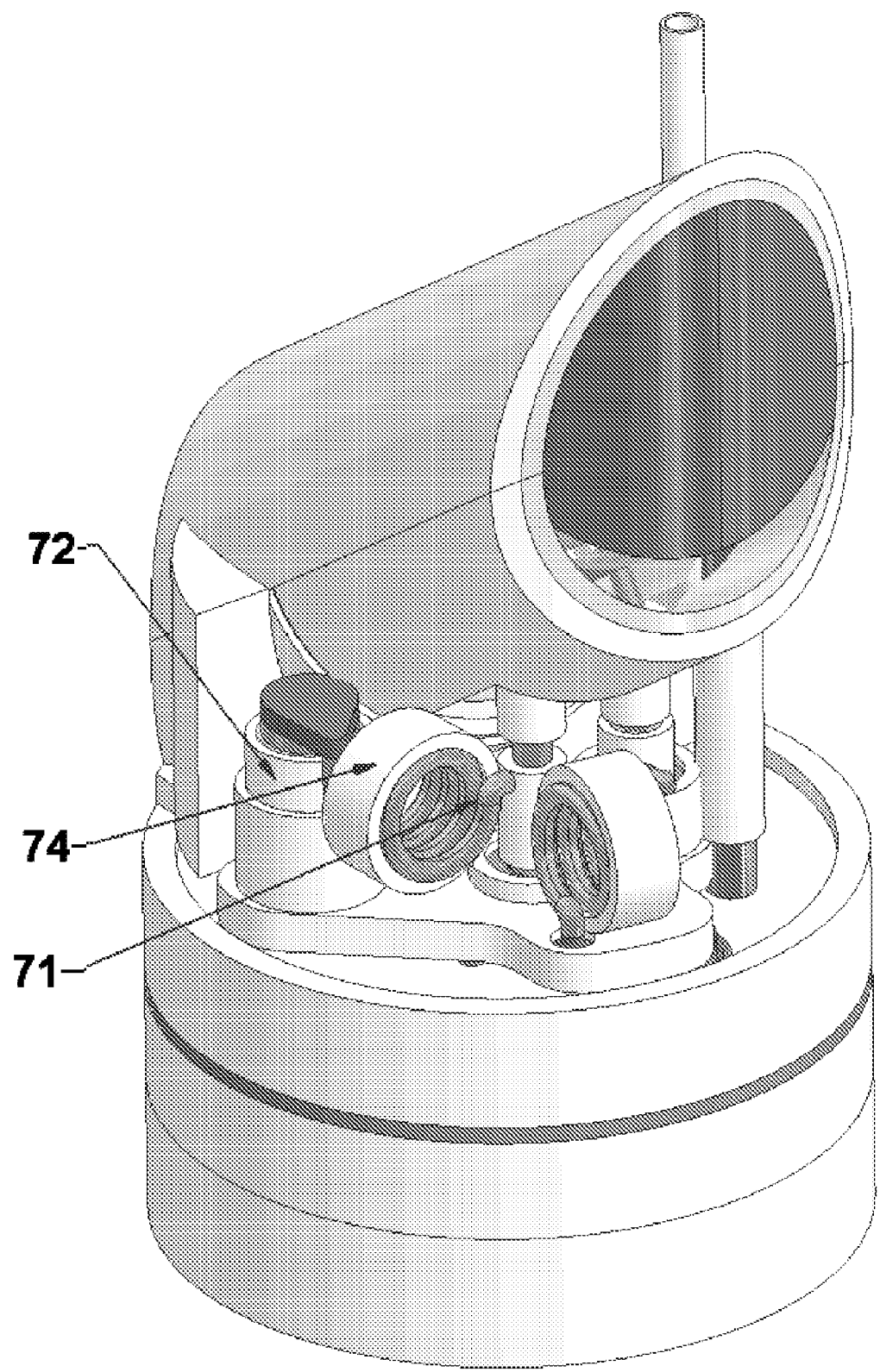
FIG. 3 is a perspective view showing several components of the probe.

The high voltage passive reactive elements required for tuning are mounted above the cold plate 54, as shown in the perspective view of some of the components in FIG. 3. These include at least one sapphire-dielectric co-axial capacitor 72 providing thermal contact from the cold plate 54 to one lead 34 of the sample solenoid 24, and normally a second smaller sapphire capacitor is used at the second solenoid lead. For the case where the solenoid 24 is double-tuned for LF and MF, tuning solenoid 71 is also required, which would preferably be of either aluminum-plated copper or solid aluminum. It is preferably covered with foamed teflon 74 for thermal insulation from the warmer helium in the cold zone 38. Additional cold capacitors and inductors in the cold zone would also be used as needed to achieve the desired tuning, channel isolation, and impedance transformations from the sample coil to the rf-feed-through elements 73 which lead to the RT tuning zone 80 below the barrier 52.

As in the prior art, sample solenoid differential voltages at the LF and MF will typically be limited to about 4 kV by the dielectric sleeve between the solenoid and the cross coil, partly because it may not be practical for the solenoid to be both double tuned and balanced at the MF when the MF is greater than 150 MHz. If the MF is unbalanced, half the MF voltage may also appear on some HF cross-coil matching elements. Standard circuit optimization methods, which keep the rf voltages and currents on the feed-through elements small compared to such on the sample solenoid, allow the noise contributions from the feed-through elements and the variable capacitors in the RT tuning zone to be kept to several percent of the total with adequate tuning adjustment range for normal sample loading ranges.

As is well known from the prior art, the preamp, rf duplexer switch, and input filters must be cooled to around 80 K for their noise contribution to be very small compared to that of the sample coil. Open-cycle nitrogen-gas first-stage cooling can easily provide the required cooling capacity down to about 80 K; but alternatively, helium gas cooling may be used for first-stage cooling to a lower temperature. Yet another possible approach is the use of cold nitrogen gas carrying droplets of liquid nitrogen. These components may be mounted in the base of the probe, according to the prior art, or in a separate compartment very near the probe if connected via very low loss transmission lines, as also in the prior art.

It may also be desirable to utilize one or more plug-in hi-power ceramic capacitors in the cold zone circuit in addition to the one or more fixed sapphire capacitors to facilitate multi-nuclear tuning, according to the prior art, even though the Qs of commercially available hi-power ceramic capacitors do not improve much as they are cooled and their Qs even at RT are much lower than is easily obtained with sapphire-dielectric hi-power coaxial capacitors.

In some cases it may be desirable to add a $^2$H lock channel to triple resonance capability. This may be best accommodated by adding a second cross coil between the inner $^1$H cross coil and the outer solenoid 24, according to the prior art. In this case, the $^1$H cross-coil is normally oriented with its $B_1$ nearly transverse to $B_0$ and made with optimal surface coverage for high magnetic filling factor and Q, while the $^2$H cross-coil, typically a 2-turn saddle coil similar to the prior art shown in U.S. Pat. No. 4,641,098, is oriented orthogonally and made with low surface coverage for minimal degradation in the performance of the $^1$H cross coil and outer solenoid.

It is also possible to effectively utilize a single solenoid 24 without an inner cross coil for double-resonance applications at least up to 7 T and possibly at 9.4 T even when the HF channel is for $^1$H, using circuits similar to those used for more than three decades in solids NMR.

Although this invention has been described herein with reference to specific embodiments, it will be recognized that changes and modifications may be made without departing from the spirit of the present invention. All such modifications and changes are intended to be included within the scope of the following claims.

The invention claimed is:

1. An NMR MAS probe for NMR investigations of a sample inside a rotor near room temperature in a magnet having static field $B_0$ greater than 4 T, said probe comprising
    a sealed, thermally insulated, cold zone external to said rotor,
    an MAS spinner assembly with at least one rf sample coil surrounding said sample in said cold zone, said assembly connected to a curved rotor-loading tube sealed from said cold zone,
    a thermally conductive second-stage cold plate inside said cold zone,
    a cold-finger dewar for accepting and insulating a sealed cold finger for cooling said second-stage cold plate,
    a tuning zone near room temperature and separated from said cold zone by a gas-sealing barrier,
    a first-stage cool plate cooled with cryogenic fluid to a temperature greater than that of said second-stage cold plate between said cold plate and said barrier,
    rf feed-through elements through said gas-sealing barrier, and
    a cooling jacket, cooled with cryogenic fluid, inside said cold zone and surrounding at least a portion of said spinner assembly,
    said cold zone further characterized as containing a plurality of additional high voltage rf reactive elements in addition to said sample coil, at least one of said additional reactive elements providing thermal contact between said sample coil and said second-stage cold plate.

2. The probe of claim 1 in which said spinner assembly is further characterized as including a zirconia dewar surrounding a zirconia gas-bearing stator.

3. The probe of claim 2 in which said spinner assembly is further characterized as including a Bernoulli axial bearing near one end.

4. The probe of claim 3 in which said spinner assembly is further characterized as including drive nozzles near the end opposite said Bernoulli bearing and said Bernoulli bearing is further characterized as of an inward-flow type.

5. The probe of claim 2 in which said ceramic dewar includes a pump-down stem, a portion of which is comprised primarily of either platinum or titanium or vanadium.

6. The probe of claim 2 in which said rotor may be pneumatically ejected and loaded through said rotor-loading tube.

7. The probe of claim 1 in which at least one of said reactive elements is a sapphire-dielectric co-axial capacitor capable of handling rf voltages greater than 1.5 kV in air at room temperature.

8. The probe of claim 1 in which at least one of said reactive elements is a tuning solenoid in thermal contact with said second-stage cold plate and comprised of wire with an aluminum surface.

9. The probe of claim 4 in which said tuning solenoid is enclosed in foamed teflon.

10. The probe of claim 1 further characterized as including at least three small metallic dewars in communication with said spinner assembly, said dewars for transport of bearing, drive, and exhaust gases, said dewars further characterized as being at least partially fabricated from a type D alloy, at least two of said dewars further characterized as having outside diameters less than 9 mm, type D alloy defined herein as an alloy whose weight composition includes at least 70% copper, less than 20% zinc, less than 20% nickel, less than 8% chromium, less than 4% aluminum, less than 4% Pb, less than 0.2% iron, less than 0.2% cobalt, and at least 2.5% from the set comprised of tin, silicon, aluminum, and chromium.

11. The probe of claim 10 further characterized as including means for heating and sensing the temperature of said bearing gas.

12. The probe of claim 10 in which two of said small dewars and said cold-finger dewar lie in the plane defined by the axis of said spinner assembly and said $B_0$.

13. The probe of claim 10 in which at least one of said small dewars is sealed through said barrier using o-rings and means are provided for minor adjustments in the orientation angle of the axis of said spinner assembly.

14. The probe of claim 10 in which at least one of said small dewars is connected to said spinner assembly using a flexible metal bellows.

15. The probe of claim 1 in which said reactive elements transform impedances such that the rf voltages on said feed-through elements are substantially less than the rf voltage across said sample coil at a resonant frequency.

16. The probe of claim 1 in which said cold zone is externally thermally insulated by a bell dewar that includes an off-center sealed access duct through the otherwise closed end and having a major fraction of its inner wall made from a type D alloy.

17. The probe of claim 16 in which said inner wall is plated with either copper or silver or gold to a thickness of at least 0.002 mm.

18. The probe of claim 1 in which said cooling jacket is further characterized as an oblique cylinder substantially surrounding said spinner assembly and partially thermally insulated from said cold zone.

19. The probe of claim 1 in which said magnet is further characterized as having room-temperature shim bore greater than 60 mm.

20. The probe of claim 1 further characterized as including a gradient coil inside said cold zone for producing a gradient in $B_0$, said gradient in $B_0$ being predominately along the spinner axis.

21. The probe of claim 20 in which said gradient coil is cooled by cryogenic fluid and mounted on a metallic coil-form of alloy type D.

22. The probe of claim 20 in which said gradient coil is capable of generating a gradient of magnitude greater than 50 G/cm at a duty cycle of greater than 1%.

23. The probe of claim 1 in which said at least one rf sample coil is further characterized as comprising an outer solenoid and an inner cross coil designed to generate an rf magnetic field predominately perpendicular to the plane defined by the axis of said spinner assembly and said $B_0$.

24. The probe of claim 23 in which said outer solenoid is further characterized as including an aluminum surface and magnetic susceptibility compensation.

25. The probe of claim 23 in which said outer solenoid is double-tuned by said reactive elements and said cross coil is tuned to a frequency greater than or equal to the fluorine NMR resonance in said $B_0$.

26. The probe of claim 25 in which said middle transverse saddle coil is tuned to the deuterium NMR resonance in said $B_0$.

27. The probe of claim 23 in which a middle transverse saddle coil is positioned between said inner cross coil and said outer solenoid, said middle transverse coil oriented so as to be magnetically orthogonal to said inner cross-coil.

28. The probe of claim 23 in which aluminum oxide is used in a thermal link between said cross coil and said outer solenoid.

29. The probe of claim 1 further characterized as including fine glass wool in said cold zone.

30. The probe of claim 1 further characterized as including foamed PTFE in said cold zone.

31. The probe of claim 1 in which at least one of said reactive elements includes plug-in connectors to facilitate replacement.

32. The probe of claim 1 further characterized in that said cold zone is either evacuated to a pressure less than 1 mTorr or pressurized with helium gas to a pressure greater than 0.11 MPa.

33. A method comprising the steps of:
    placing a sample inside a rotor;
    placing the rotor into a spinner assembly of an NMR probe, the spinner assembly comprising an rf sample coil surrounding said sample;
    using a first-stage cryogenic fluid for partial cooling of a cold zone external to said sample;
    by means of a reactive element providing thermal contact between the sample coil and a cold plate, causing said rf sample coil in said cold zone to be further cooled;
    maintaining the sample near room temperature;
    applying a static field $B_0$ greater than 4 T to the sample; and
    spinning the rotor on an axis.

34. The method of claim 33 further comprising the step of producing a gradient in $B_0$, the gradient being predominately along the spinner axis.

35. The method of claim 33 further comprising the step of evacuating the cold zone to a pressure less than 1 mTorr.

36. The method of claim 33 further comprising the step of pressurizing the cold zone with helium gas to a pressure greater than 0.11 MPa.

37. The method of claim 33 further comprising the step of ejecting the rotor from the spinner assembly through a curved tube.

* * * * *